(12) United States Patent
Swaminathan (10) Patent No.: US 8,183,888 B2
(45) Date of Patent: May 22, 2012

(54) PARITY UNIT USING 3-INPUT NANDS

(75) Inventor: Kartik Swaminathan, Munich (DE)

(73) Assignee: Elpida Memory, Inc., Tokyo (JP)

( * ) Notice: Subject to any disclaimer, the term of this patent is extended or adjusted under 35 U.S.C. 154(b) by 157 days.

(21) Appl. No.: 12/772,481

(22) Filed: May 3, 2010

(65) Prior Publication Data

US 2011/0267105 A1    Nov. 3, 2011

(51) Int. Cl.
  *G01R 19/22* (2006.01)
(52) U.S. Cl. .................. 326/104; 326/105; 326/113
(58) Field of Classification Search ............... 326/59, 326/104–105, 113; 711/122, 135, 136; 708/200, 708/230
See application file for complete search history.

(56) References Cited

U.S. PATENT DOCUMENTS

| | | | | |
|---|---|---|---|---|
| 4,349,875 A | * | 9/1982 | Tada ........................... | 711/135 |
| 4,905,139 A | * | 2/1990 | Asai et al. ................... | 711/136 |
| 5,140,690 A | * | 8/1992 | Hata et al. ................... | 714/5.1 |
| 5,584,013 A | * | 12/1996 | Cheong et al. ............... | 711/122 |
| 5,845,320 A | * | 12/1998 | Pawlowski .................... | 711/136 |
| 7,376,868 B2 | * | 5/2008 | Yoshizawa et al. ........... | 714/42 |
| 2006/0173941 A1 | * | 8/2006 | Busaba et al. ............... | 708/200 |
| 2008/0168115 A1 | * | 7/2008 | Busaba et al. ............... | 708/230 |

* cited by examiner

*Primary Examiner* — Vibol Tan
(74) *Attorney, Agent, or Firm* — Morrison & Foerster LLP (57) ABSTRACT

Disclosed herein is a logic circuit which responds to three signals to detect whether the number of signals taking one of logic-1 and logic-0 is odd or even, and includes five NAND gates. The first NAND gate is supplied with the first signal, the second signal and the third signal; the second NAND gate is supplied with the inverted first signal, the inverted second signal and the third signal; the third NAND gate is supplied with the first signal, the inverted second signal and the inverted third signal; and the fourth NAND gate is supplied with the inverted first signal, the second signal and the inverted third signal. The fifth NAND gate is supplied with outputs of first, second, third and fourth NAND gates and produces the output signal whose logic level is dependent on whether the number of the input signals taking one of logic-1 and logic-0 is odd or even.

21 Claims, 7 Drawing Sheets

Setup equation : tdelay = tc2Q + tXORmax + tsetup    (1)
Hold equation  : tdelay = tck(min) + tXORmin + tc2Q    (2)

Equations (1) & (2) give the following:
tck(min) = (tXORmax − tXORmin) + tsetup    (3)

PARITY UNIT USING 3-INPUT NANDS

BACKGROUND OF THE INVENTION

The invention relates to an XOR network and a system comprising such an XOR network that is commonly used e.g. for parity checking or calculation of a binary sum.

DESCRIPTION OF RELATED ART

In logic gate circuits, one common objective is to generate digital outputs from digital inputs where the digital outputs are particular logic operations/functions of the digital inputs. For example, integrated circuits use logic circuits having electronic devices called "gates", which utilize Boolean algebra to perform the logic tasks.

Complex logic operations are realized by connecting logic gates in a way that the desired logic function is performed. A logic operation is desired that produces an output of logic 1 if the number of inputs with logic 1 is odd (i.e. 1, 3, 5, or 7 and so on) and an output of logic 0 if the number of inputs with logic 1 is even (i.e. 0, 2, 4, or 6 and so on). In other words, a logic unit calculating the numbers of logic 0s and logic 1s from a plurality of inputs is desired and may be used as a unit for parity checking or calculation of a binary sum of a plurality of inputs.

Figure 1:
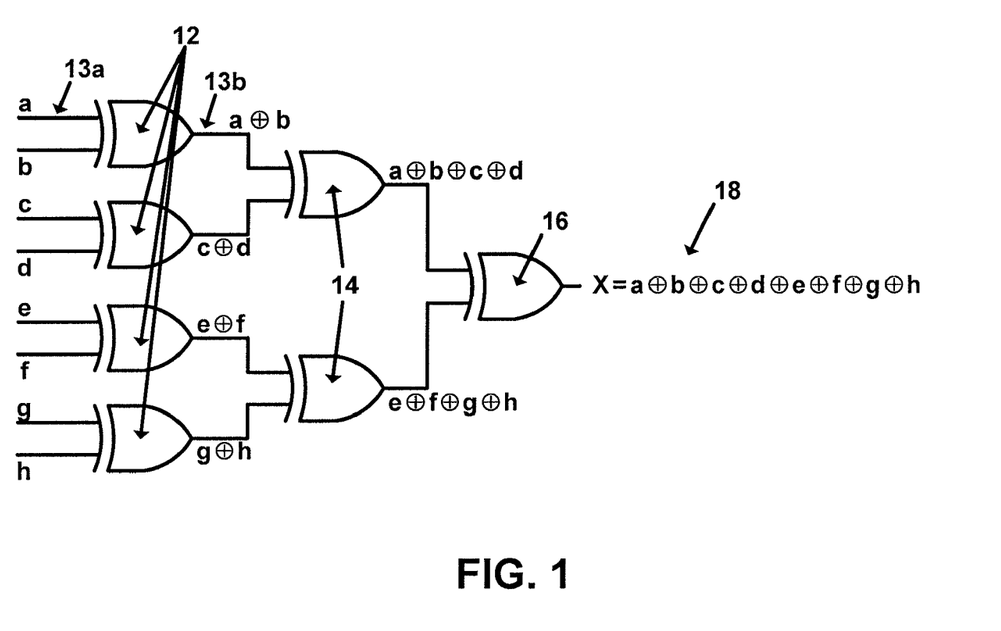
FIG. 1 schematically shows a conventional XOR gate realization for the calculation of an 8-input parity system.

Referring now to FIG. 1, a logic unit 10 as discussed above is shown with eight inputs a-h and one output X. Usually, such a logic unit comprises seven XOR gates 12, 14, 16 each with two inputs 13a and one output 13b. The XOR gates are cascaded and three stages of XOR gates 12, 14, 16 are required to perform the parity checking or calculation operation as described above for the eight inputs. The number of logic stages is also called "logic depth."

Figure 2A:
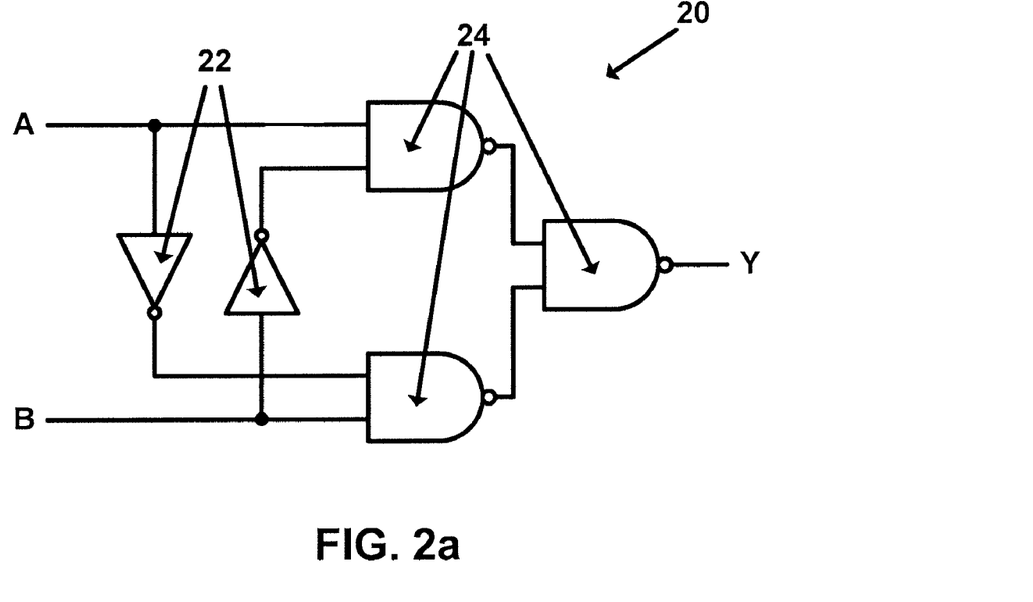
FIGS. 2a and 2b schematically show the construction of a conventional XOR gate using 2-input NAND gates, inverters and without and with buffers, respectively.

FIG. 2a shows a realization of a single XOR gate 20 with two inputs A, B and one output Y. In particular, an XOR gate 20 may consist of two inverters 22 and three 2-input NAND gates 24. The inverters 22 produce the inverted input signals of the inputs A and B, respectively. The gate 20 thus has two signal paths from the input A or B to the output Y, one being a logic depth of two, and the other being a logic depth of three.

Figure 2B:
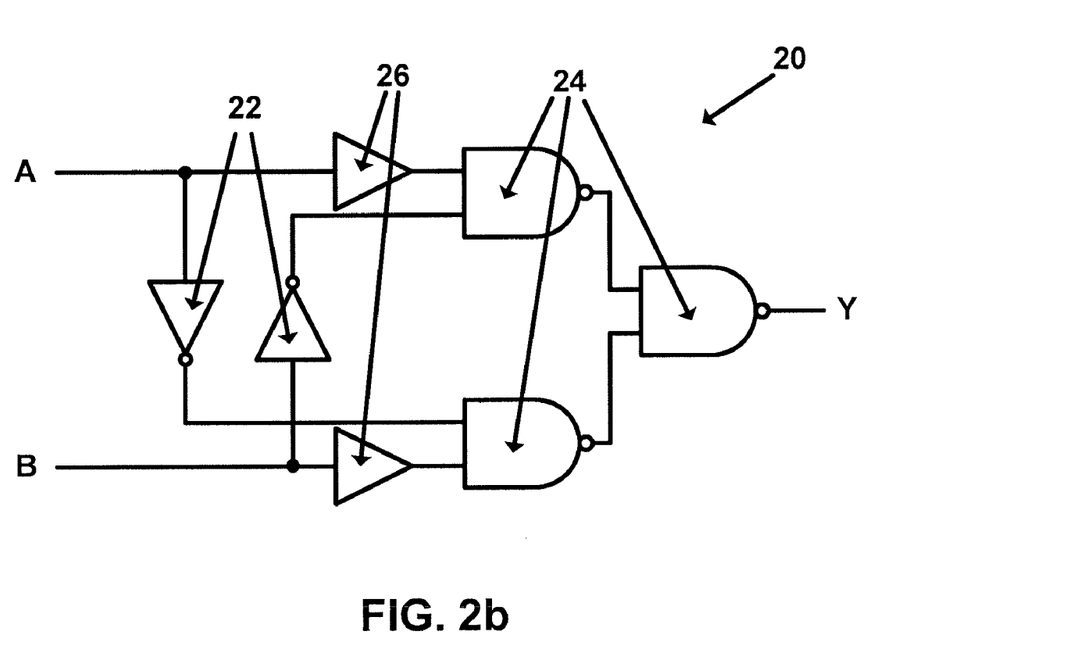

That difference in logic depth for performing logic operation on the two inputs A and B leads to a difference in signal propagation time from inputs A and B to output Y. This difference in signal propagation time is also known as "signal skew". The skew may, for example, be reduced as shown in FIG. 2b by adding logic buffers 26 as pass gates in those signal paths not requiring the logic inversion. Advantageously, the buffer's delay shall be balanced to be equal to the inverter's propagation delay in order to minimize skew. The gate 20 as shown in FIG. 2b thus has a logic depth of three.

Consequently, the logic unit 10 as shown in FIG. 1 has its logic depth of nine, thus leading to deterioration in operation speed.

Figure 3A:
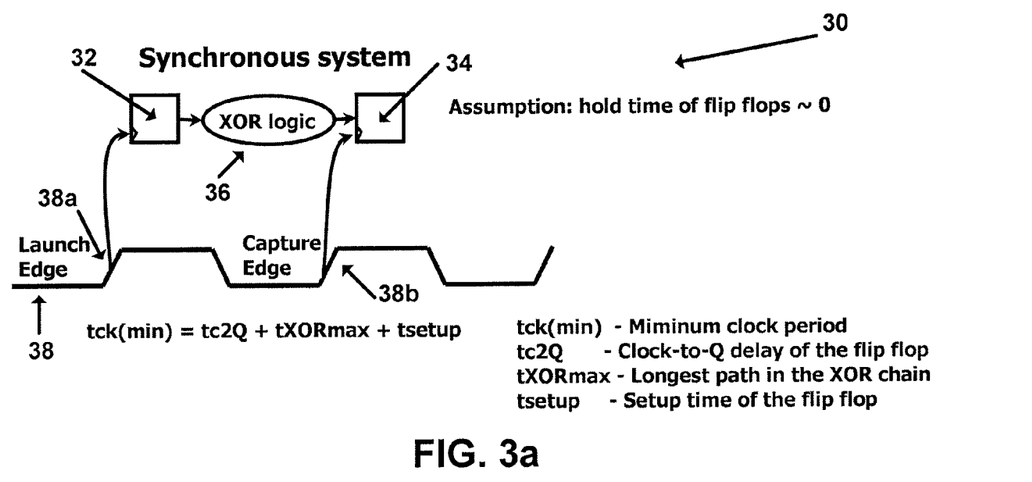
FIGS. 3a and 3b schematically show the difference of a synchronous system and a wave-piped system.
Figure 3B:
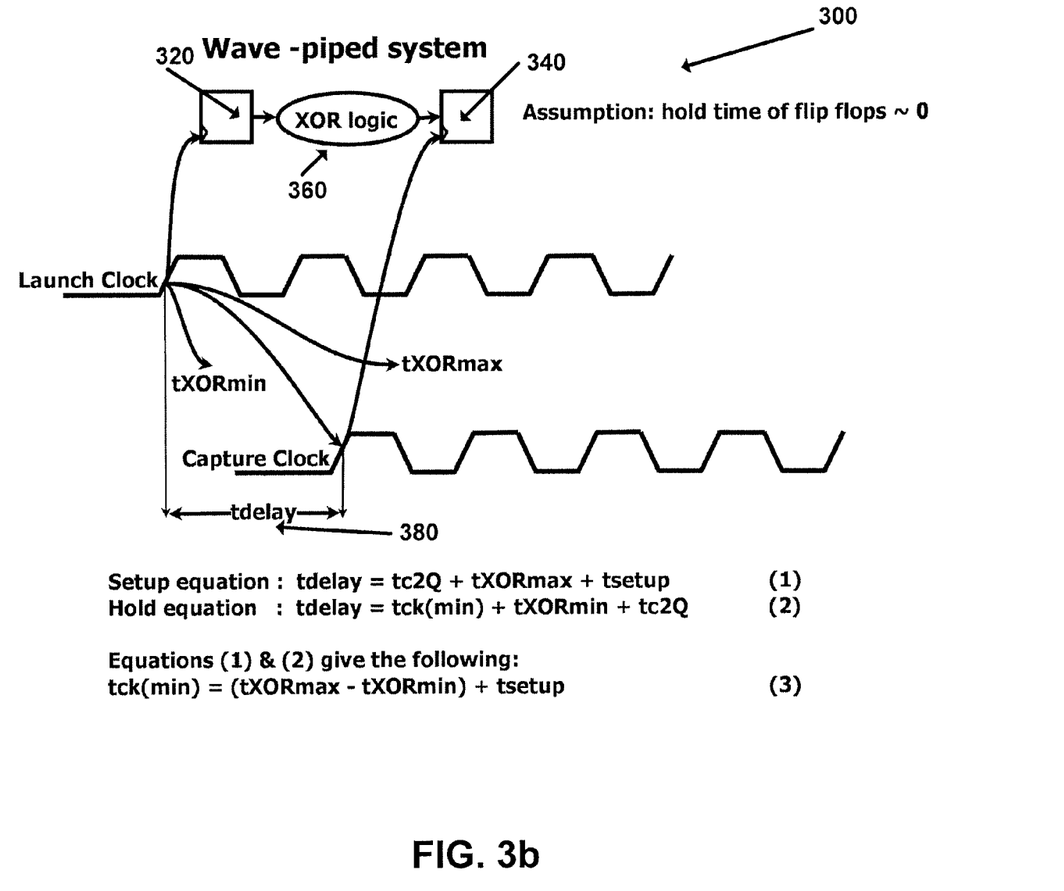

FIGS. 3a and 3b describe in the general concept how the speed of a logic network, specifically an XOR network, depends on the signal skew resulting from the signal path through the network. In a fully synchronous implementation 30 as shown in FIG. 3a, the XOR logic network 36, which is the logic unit 10 of FIG. 1, is connected between two flip-flops 32 and 34; these two flip-flops 32, 34 being supplied in common with the same clock signal 38. At every rising or leading edge 38a of the clock signal 38, the first flip-flop 32 outputs a new data word to the XOR network 36. The XOR logic network is thus required to complete its logic operation on the new data within one clock cycle that corresponds to a period of time between the adjacent two leading edges 38a and 38b of the clock signal 38.

The propagation delay, therefore, is one clock cycle, and the minimum clock cycle time is given by the maximum delay through the network, the clock-to-output delay of the first flip-flop and the input setup time of the second flip-flop. In this implementation, always only a single data word is travelling through the XOR network, i.e. a succeeding data word is input to the XOR network only after the result of the preceding data word has been captured.

One way to increase the operating speed is to issue a succeeding data word while the preceding data word is still passing through the XOR network. This is commonly known as "wave-piped system" and shown in FIG. 3b. The requirement for such a system 300 is that a succeeding data word is launched not earlier than a certain time after the preceding data word so that, independent of the actual data pattern and data pattern dependent signal propagation delay, the output of the preceding data word can be captured by the second flip-flop 340 before it is overwritten by the network's output of the succeeding data word. Three conditions are needed to define this relationship and to thus achieve the characteristics of a wave-pipe system:

a) the phase delay 380 between the launching flip-flop 320 and the capturing flip-flop 340 must be equal or larger than the longest signal path through the network 360 plus the clock-to-output delay of the first flip-flop 320 plus the data input setup time of the second flip-flop 340;

b) the phase delay 380 between the launching flip-flop 320 and the capturing flip-flop 340 must be equal to or shorter than the sum of one clock period and the shortest signal path through the network plus the clock-to-output delay of the first flip-flop 320;

c) conditions a) and b) combined define the minimum clock cycle time as the difference between the longest and the shortest signal path or, in other words, the skew between different outputs of the XOR network.

SUMMARY OF THE INVENTION

According to a first aspect of the present invention, there is provided a 3-input parity checking unit with three inputs for input signals a, b, c and with an output. The parity checking unit comprises four 3-input logic NAND gates at a first logic stage, wherein the three inputs for input signals a, b, c are connected to the inputs of the first NAND gate, wherein the inputs of the second NAND gate are configured to receive inverted input signal a', inverted input signal b', and input signal c, wherein the inputs of the third NAND gate are configured to receive input signal a, inverted input signal b', and inverted input signal c', wherein the inputs of the fourth NAND gate are configured to receive inverted input signal a', input signal b, and inverted input signal c', and wherein the outputs of the four NAND gates at the first logic stage are connected to the inputs of a 4-input logic NAND gate providing the output of the 3-input parity checking unit at a second logic stage.

According to a second aspect of the present invention, there is provided a system for calculating the parity of an n-bit wide data signal input. The system comprises at least one 3-input parity checking unit as defined above.

According to a third aspect of the present invention, such a system is provided that comprises a plurality of 3-input parity checking units, wherein the units are cascaded for calculating a n-bit wide input signal pattern, and wherein each of the 3-input parity checking units comprises four 3-input NAND gates at a first logic stage and one 4-input NAND gate at a second logic stage.

The present invention thus allows to quickly determining the parity of an equation, for example by using a particular combination of parity checking units dependent on the number of terms in the equation. The final logic digit of the binary code is an indication for the parity of the equation which terms were originally received by the inputs of the parity checking units of the first stage.

A "parity checking unit" as described herein is configured to determine the parity of the terms received by the inputs of the unit. For example, if the unit is a 3-bit parity checking unit, the unit comprises three inputs, wherein each input in configured to receive one logic term (0, 1) of the equation. Then, the parity checking unit may determine whether an odd or even number of logic 1 is received by/at the inputs. Dependent on this determination, the parity checking unit provides (a) a logic 1 or (b) a logic 0 at the output of the unit, if the number of the logic 1 is (a) odd or (b) even. An "odd" number means the positive integers 1, 3, 5, 7 . . . , whereas an "even" number means the positive integers 2, 4, 6, 8 . . . .

Due to the use of NAND gates, for example provided by n-FETs connected in series, the parity checking unit of the present invention is much faster than XOR systems for example provided by p-FETs connected in series.

For example, the parity checking unit may be a 3-bit (i.e. 3-input) parity checking unit having three inputs, each input configured to receive one term of the equation to be calculated. That means that a 3-bit parity checking unit may be configured to determine the parity of a sub-term of the term to be calculated, wherein the sub-term consists of three terms, for example, a, b, c. The terms a, b, and c are calculated in the parity checking unit by means of four NAND gates in parallel (at a first logical stage), wherein the four NAND gates calculate the NAND operation, for example, by using the four sets of terms (a, b, c), ($\bar{a}$, $\bar{b}$, c), (a, $\bar{b}$, $\bar{c}$), and ($\bar{a}$, b, $\bar{c}$). The calculations carried out by the NAND gates may be provided to a further (fifth) NAND gate (at a second logical stage) connected in series to the first stage of NAND gates and further carries out a NAND operation with the results of the calculations of the (four) NAND gates at the first stage. The results of the calculation of the NAND gates at the first stage and the further NAND gates at the second stage are digits of the binary code, i.e. a logic 1 or a logic 0.

For example, the result of the calculation of the final NAND gate (at the last stage) advantageously provides (a) a logic 1 or (b) a logic 0, indicating that an (a) odd or (b) even number of logic 1 were present at the inputs of the parity checking unit.

In a particular embodiment, the parity checking units are connected in parallel at a first stage of the system, wherein the equation to be transformed consists of n inputs and wherein the number of the parity checking units is round up (n/3) at a first logical stage, and wherein the system comprises a second stage of round up (n/9) parity checking units for n>3. In other words, the number of 3-bit parity checking units at the $m^{th}$ stage of the whole system is "round up(n/$3^m$)" if the number of units at the (m-1)$^{th}$ stage is larger than 1, and wherein the number of the 3-input parity checking units at the $m^{th}$ stage is 0 if the number of units at the (m-1)$^{th}$ stage is 1. The total number of required 3-bit parity checking units can be calculated as (round up(n/$3^1$)+round up(n/$3^2$)+ . . . +round up(n/$3^m$)).

For example, the 3-bit parity checking unit has three inputs, wherein each input is configured to receive a logic term of the equation to be calculated. "n" is a positive integer, and n/3 is also positive integer or—if n/3 results in a decimal—n/3 is rounded up to the next positive integer (for example, if n/3 results in 2.2, the positive integer "3" is meant). In particular, the expression "round up(n/$3^m$)" means that the result (decimal) of n/3, n/9, . . . for the number of units in the first, second, . . . stage of the cascade of units in the whole system is calculated by rounding up the quotient (for example, 2.1, 2.2, 2.3, . . . , 2.7, 2.8, 2.9 are rounded up to 3).

By providing a particular arrangement (for example, a cascade) of parity checking units in the system, the system may advantageously be adapted to a particular width of the input signal pattern to be calculated. For example, the input signal pattern may be represented by the equation consisting of n XOR terms in series and the number n of the logic terms reflects the width of the input signal pattern.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Figure 4:
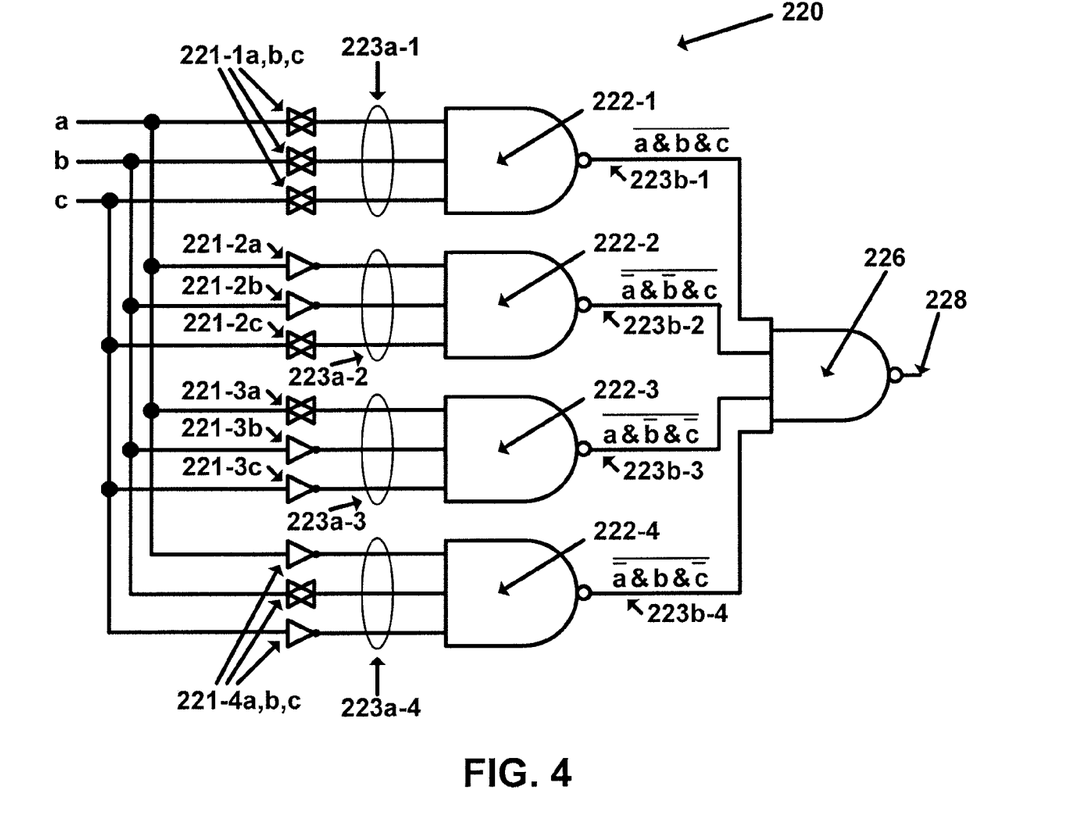
FIG. 4 schematically shows a 3-input parity checking unit according to an embodiment of the present invention, comprising four 3-input NAND gates and one 4-input NAND gate, wherein four units may be used in the system of FIG. 5.

Referring now to FIG. 4, a unit 220 according to an embodiment of the present invention is shown as a parity checking unit for three input signals (data) a, b and c, and includes four NAND gates 22-1 to 222-4 each having three inputs 223a and one output 223b. As will be discussed in FIG. 6, each of the NAND gates 222-1, 222-2, 222-3, 222-4 may be provided/realized by three n-FETs (n-channel MOSFETs) connected in series between the output and a reference or ground voltage line and three p-FETs (p-channel MOSFETs) connected in parallel between the output and a power voltage line. The parity checking unit may be configured to provide a first one of the NAND gates 222 with the non-inverted signals of the inputs a, b, c; a second NAND gate with inverted signals $\bar{a}$, $\bar{b}$, of the inputs a and b and the non-inverted signal of input c; a third NAND gate with the non-inverted signal of the input a and the inverted signals $\bar{b}$ and $\bar{c}$ of the inputs b and c; and a fourth NAND gate with the inverted signals $\bar{a}$ and $\bar{c}$ of the inputs a and c and the non-inverted signal of the input b. To this end, there are provided six inverters 221-2a, 221-2c, 221-3b, 221-3c, 221-4a and 221-4c as an inverter circuit to produce the inverted signals of the inputs a, b and c. There are further provided, for the purpose of balancing any signal skews, six buffers 221-1a, 221-1b, 221-1c, 221-2c, 221-3a, 221-4b as a buffer circuit to produce the non-inverted signals of the inputs a, b and c.

The unit further includes a NAND gate 226 supplied as its four inputs with the outputs 223b of the NAND gates 222-1 to 222-4. As is also discussed in FIG. 6, the NAND gate 226 may be provided/realized by four n-FETs connected in series between the output and the reference or ground voltage line and four p-FETs connected in parallel between the output and the power voltage line. The output of the NAND gate 226 is derived as an output 228 of the unit 220 from which a logic 1 or logic 0 is produced, dependent on whether the number of inputs taking logic 1 is odd or even.

The following Table-1 shows the logic operations of the first NAND gate 222-1:

TABLE 1

| a (at first input) | b (at second input) | c (at third input) | Output of 3-input NAND 222-1 |
|---|---|---|---|
| 1 | 0 | 0 | 1 |
| 1 | 1 | 1 | 0 |
| 1 | 1 | 0 | 1 |
| 0 | 0 | 0 | 1 |
| 0 | 1 | 0 | 1 |
| 0 | 0 | 1 | 1 |
| 0 | 1 | 1 | 1 |
| 1 | 0 | 1 | 1 |

The logic operations of the other three NAND gates 222-2, 222-3 and 222-4 are listed in the following Table-2, Table-3 and Table-4, respectively.

TABLE 2

| ā (at first input) | b̄ (at second input) | c (at third input) | Output of 3-input NAND 222-2 |
|---|---|---|---|
| 0 | 1 | 0 | 1 |
| 0 | 0 | 1 | 1 |
| 0 | 0 | 0 | 1 |
| 1 | 1 | 0 | 1 |
| 1 | 0 | 0 | 1 |
| 1 | 1 | 1 | 0 |
| 1 | 0 | 1 | 1 |
| 0 | 1 | 1 | 1 |

TABLE 3

| a (at first input) | b̄ (at second input) | c̄ (at third input) | Output of 3-input NAND 222-3 |
|---|---|---|---|
| 1 | 1 | 1 | 0 |
| 1 | 0 | 0 | 1 |
| 1 | 0 | 1 | 1 |
| 0 | 1 | 1 | 1 |
| 0 | 0 | 1 | 1 |
| 0 | 1 | 0 | 1 |
| 0 | 0 | 0 | 1 |
| 1 | 1 | 0 | 1 |

TABLE 4

| ā (at first input) | b (at second input) | c̄ (at third input) | Output of 3-input NAND 222-4 |
|---|---|---|---|
| 0 | 0 | 1 | 1 |
| 0 | 1 | 0 | 1 |
| 0 | 1 | 1 | 1 |
| 1 | 0 | 1 | 1 |

TABLE 4-continued

| ā (at first input) | b (at second input) | c̄ (at third input) | Output of 3-input NAND 222-4 |
|---|---|---|---|
| 1 | 1 | 1 | 0 |
| 1 | 0 | 0 | 1 |
| 1 | 1 | 0 | 1 |
| 0 | 0 | 0 | 1 |

The output of the 4-input NAND gate 226 at the second stage in FIG. 4, which is responsive to eight combinations in logic level outputs of the gates 221-1 to 222-4 based on eight combinations in logic level of the inputs a, b, c, is indicated in the following Table-5:

TABLE 5

| Output of first NAND 222-1 | Output of second NAND 222-2 | Output of third NAND 222-3 | Output of fourth NAND 222-4 | Output of 4-input NAND 226 |
|---|---|---|---|---|
| 1 | 1 | 0 | 1 | 1 |
| 0 | 1 | 1 | 1 | 1 |
| 1 | 1 | 1 | 1 | 0 |
| 1 | 1 | 1 | 1 | 0 |
| 1 | 1 | 1 | 0 | 1 |
| 1 | 0 | 1 | 1 | 1 |
| 1 | 1 | 1 | 1 | 0 |
| 1 | 1 | 1 | 1 | 0 |

Thus, the logic level of the output 228 of the unit 220 is determined by the combination in logic level of the inputs a, b and c as shown in the following Table-6.

TABLE 6

| a | b | c | Output 228 of 3 Unit 220 |
|---|---|---|---|
| 1 | 0 | 0 | 1 |
| 1 | 1 | 1 | 1 |
| 1 | 1 | 0 | 0 |
| 0 | 0 | 0 | 0 |
| 0 | 1 | 0 | 1 |
| 0 | 0 | 1 | 1 |
| 0 | 1 | 1 | 0 |
| 1 | 0 | 1 | 0 |

That is, the output 228 of the unit 220 is at logic 1 when the number of the input taking logic 1 is odd (i.e. 1 or 3) and logic 0 when the number of the input taking logic 1 is even (i.e. 0 or 2).

Figure 5:
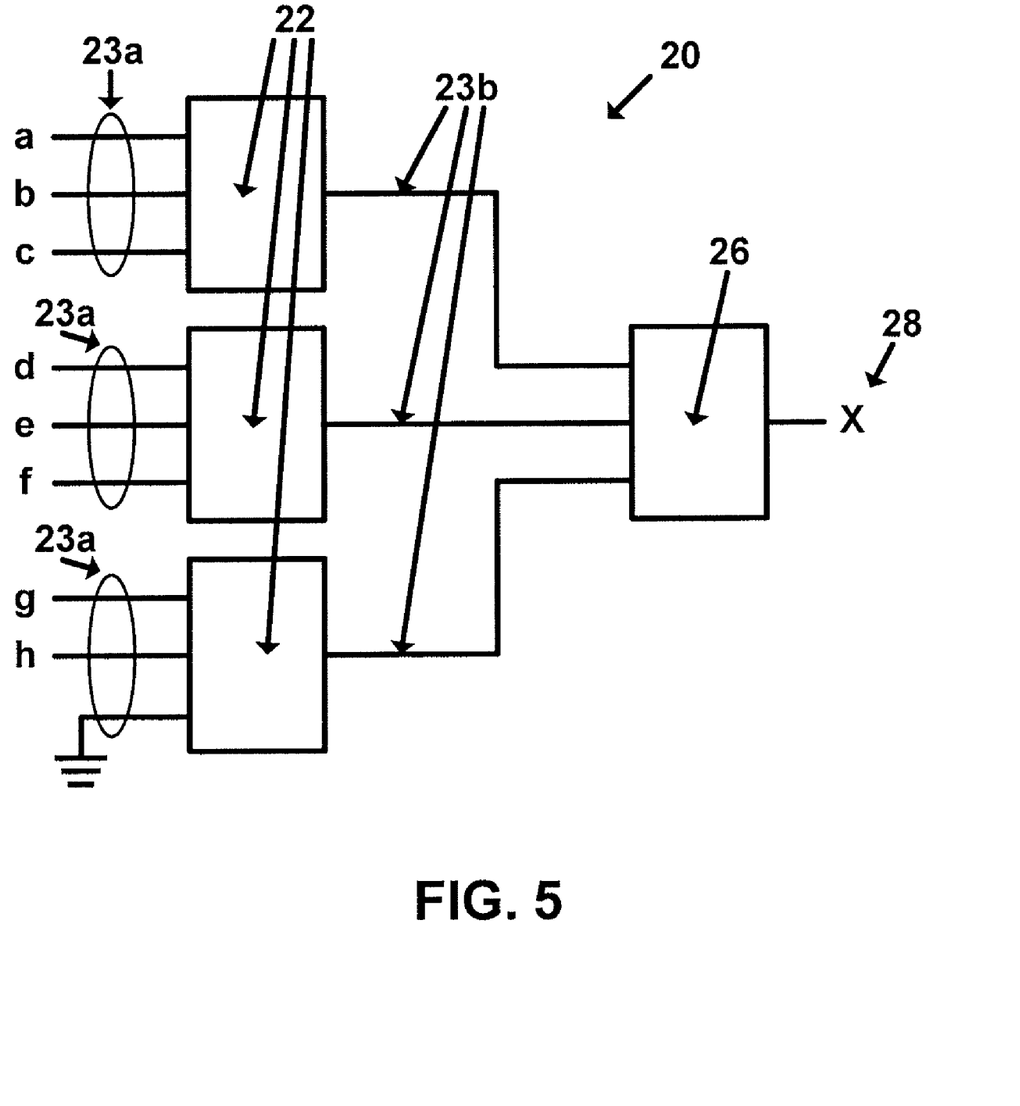
FIG. 5 schematically shows a system according to another embodiment of the present invention, comprising four parity checking units.

FIG. 5 exemplarily shows another embodiment of the present invention relating to a system 20 for 8-bit binary inputs (also called a "byte"), which thus uses three 3-bit parity checking units 22 and a fourth 3-bit parity checking unit 26 as described above with reference to FIG. 4. The system 20 enables to speed up the intended or required logic operation by means of the following concept: each 3-bit parity checking unit 22 provides a logic 1 at its output 23b if there is an odd number (i.e. 1 or 3) of logic 1 at the three inputs 23a of the unit 22. If there is an even number (0 or 2) of logic 1 at the three inputs 23a of the respective unit 22, the unit 22 outputs a logic 0. The logic values provided at the outputs 23b of the three units 22 are then received by the 3-bit parity checking unit 26 which in turn outputs as a result 28 of the unit 220 a logic 1 if the number of logic 1 is odd at the three inputs of the unit 26. If the number of logic 1 at the three inputs is even, the unit 26 outputs a logic 0.

In other words, the concept schematically shown in FIG. 5 provides a re-mapped solution, wherein the solution only takes into account the parity of the equation to be calculated.

By realizing the above-described concept of the present invention, the logic depth of the logic system as shown in FIG. 5 amounts to six in total, because each of the units 22 and 26 has a logic depth of three (3) as shown in FIG. 4. On the other hand, the logic depth of the known system as described with reference to FIG. 1 results in a logic depth of 9 as discussed above. Since the logic depth indicates the duration of an operation of the system, the system according to the present invention, having a lower logic depth, thus results in much faster operation speeds than FIG. 1 systems with significant less skew.

Accordingly, the logic network employing the logic unit 220 is applicable to each network system as shown in FIG. 3 with great margins in operation speed.

Figure 6:
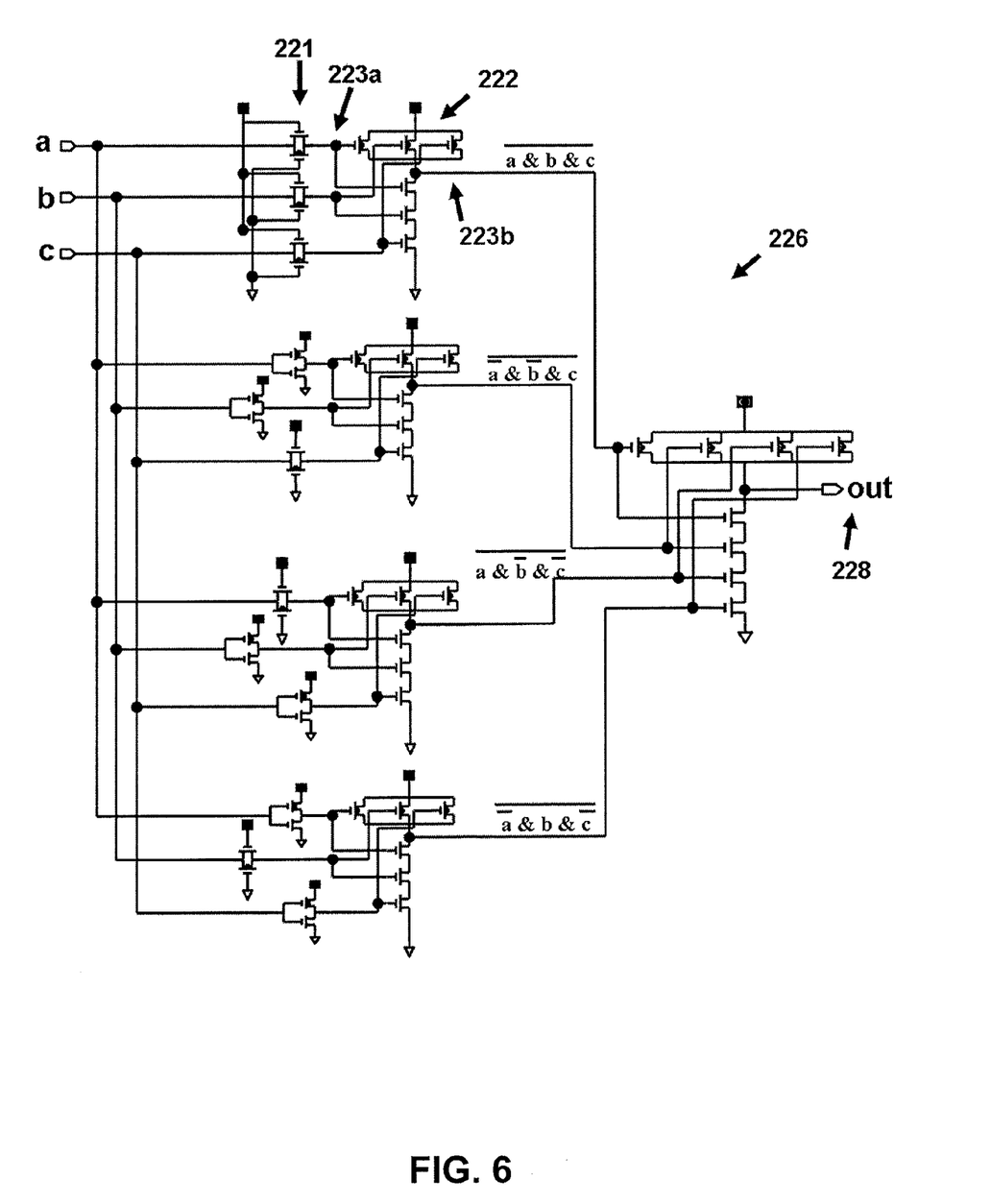
FIG. 6 schematically shows the realization of the 3-input parity checking unit as shown in FIG. 4 using n-FET-, p-FET- and pass-gate-transistors.

Each of the units 220 (FIG. 4) and the units 22 and 26 (FIG. 5) may be realized by the circuit shown in FIG. 6, comprising three 3-input NAND gates 222, a 4-input NAND gate 226, and inverters/buffers 221 as discussed above.

In a particular embodiment, each 3-input NAND gate 222 is provided by three n-FETs connected in series between the output and the ground line and three p-FETs connected in parallel between the output and the power line. The 4-input NAND gate 226 includes four n-FETs connected in series between the output and the ground line and four p-FETs connected in parallel between the output and the power line. Each inverter 221 is constituted as a CMOS inverter including a pair of n-FET and p-FET, and each buffer 221 is constituted as a CMOS transmission gate including a pair of n-FET and p-FET.

Each FET may be a metal-oxide-semiconductor field-effect transistor (MOSFET). The operation of such a transistor is based on the modulation of charge concentration by the capacitance between a body electrode and a gate electrode. The MOSFET further includes two additional terminals (source and drain), each connected to individual highly doped regions that are separated by the body region. In case of an n-FET, these regions are of n-type and highly doped. With sufficient gate voltage, electrons from the source enter the n-channel thus forming a conducting channel extending between the source and the drain. In a p-FET, the source and drain regions are of a p-type and the channel region is of an n-type.

While the invention has been illustrated and described in detail in the foregoing description, such illustration and description are to be considered illustrative or exemplary and non-restrictive; the invention is thus not limited to the disclosed embodiments. Features mentioned in connection with one embodiment described herein may also be advantageous as features of another embodiment described herein without explicitly showing these features. Variations to the disclosed embodiments can be understood and effected by those skilled in the art and practicing the claimed invention, from a study of the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures can not be used to advantage.

What is claimed is:

1. A unit with three inputs for input signals a, b, c and with an output, comprising:
   four 3-input logic NAND gates,
   wherein the three inputs for input signals a, b, c are connected to the inputs of the first NAND gate,
   wherein the inputs of the second NAND gate are configured to receive inverted input signal a, inverted input signal b, and input signal c,
   wherein the inputs of the third NAND gate are configured to receive input signal a, inverted input signal b, and inverted input signal c,
   wherein the inputs of the fourth NAND gate are configured to receive inverted input signal a, input signal b, and inverted input signal c, and
   a 4-input logic NAND gate,
   wherein the outputs of the four NAND gates are connected to the inputs of the 4-input logic NAND gate to provide an output of the unit.

2. Unit of claim 1, comprising inverters configured to invert input signals a, b, c and to provide inverted signals a, b, c, respectively.

3. Unit of claim 2, wherein each of the inverters is connected between an associated one of the three inputs of the unit and an associated one of the four 3-input NAND gates.

4. Unit of claim 3, further comprising at least one buffer connected between one of the three inputs of the unit and one of the four 3-input NAND gates.

5. Unit of claim 4, wherein the buffer is configured to compensate the propagation delay of the inverters.

6. Unit of claim 5, wherein the buffer is a pass gate.

7. Unit of claim 1, wherein the input signal propagation delay through the unit is independent from the input signal pattern.

8. Unit of claim 1, wherein one of the three inputs of the unit is connected to logic 0 if the number of input signals is two.

9. A system comprising:
   at least one 3-input unit with inputs A, B and C and an output Y, wherein the unit comprises:
   first, second, third and fourth NAND gates; the inputs A, B and C being supplied to the first NAND gate; an inverted input A, an inverted input B and the input C being supplied to the second NAND gate; the input A, the inverted input B and an inverted input C being supplied to the third NAND gate; the inverted input A, the input B and the inverted input C being supplied to the fourth NAND gate; and
   a 4-input NAND gate receiving outputs of the first, second, third and fourth NAND gates to produce an output of the unit; and
   a plurality of inverters provided to produce the inverted input signals A, B and C.

10. The system of claim 9, wherein buffers are provided to supply each of the inputs A, B and C to an associated one of the NAND gates.

11. The system of claim 10, wherein a signal propagation delay through the unit is substantially independent of data pattern of the inputs A, B and C.

12. The system of claim 9, wherein multiple ones of the 3-input unit are cascaded to achieve an n-bit wide unit.

13. The system of claim 12, wherein the number of the multiple ones of the 3-input unit to be cascaded for an n-bit wide parity unit is determined by the number of input signals and a 3-to-1 compression rate per stage.

14. The system of claim 12, wherein unused inputs may be connected to logic 0 if the number of inputs of the n-bit wide parity does not equal to 3 of the power of m.

15. A device comprising:
   a logic unit receiving first, second and third signals and producing an output signal, the logic unit comprising;
   an inverter circuit producing an inverted first signal that is an inverted signal of the first signal, an inverted second signal that is an inverted signal of the second signal, and an inverted third signal that is an inverted signal of the third signal, a first NAND gate supplied with the first signal, the second signal and the third signal, a second NAND gate supplied with the inverted first signal, the inverted second signal and the third signal, a third NAND gate supplied with the first signal, the inverted second signal and the inverted third signal, a fourth NAND gate supplied with the inverted first signal, the second signal and the inverted third signal, and a fifth NAND gate supplied with outputs of first, second, third and fourth NAND gates to produce the output signal.

16. The device as claimed in claim 15, further comprising a buffer circuit that supplies the first, second and third signals to the first NAND gate, the third signal to the second NAND gate, the first signal to the third NAND gate, and the second signal to the fourth NAND gate.

17. The device as claimed in claim 15, wherein the logic unit is a first logic unit and the device further comprises second, third and fourth logic units, each of the second, third and fourth logic units being the same in circuit construction as the first logic unit to comprise an inverter circuit and four NAND gates, the second logic unit receiving fourth, fifth and sixth signals and producing an output signal, the third logic unit receiving seventh, eighth and ninth signals and producing an output signal, and the fourth logic unit receiving the output signals of the first, second and third logic units to produce an output signal of the device.

18. The device as claimed in claim 17, wherein the ninth signal is held at logic 0.

19. The device as claimed in claim 17, wherein each of the first, second, third and fourth logic units further comprises a buffer circuit to supply each of the first to ninth signals to an associated one of the NAND gates.

20. Unit of claim 1, wherein two of the three inputs of the unit are connected to logic 0 if the number of input signals is one.

21. Unit of claim 1, wherein at least one of the three inputs of the unit is connected to logic 0 if no input signal is supplied to the at least one of the three inputs.

\* \* \* \* \*